(12) United States Patent
Blahnik et al.

(10) Patent No.: US 9,016,998 B2
(45) Date of Patent: Apr. 28, 2015

(54) HIGH THROUGHPUT, LOW VOLUME CLAMSHELL LOAD LOCK

(71) Applicant: Varian Semiconductor Equipment Associates, Inc., Gloucester, MA (US)

(72) Inventors: Jeffrey C. Blahnik, Leander, TX (US); Robert Brent Vopat, Austin, TX (US); William T. Weaver, Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 103 days.

(21) Appl. No.: 13/803,430

(22) Filed: Mar. 14, 2013

(65) Prior Publication Data

US 2014/0271048 A1    Sep. 18, 2014

(51) Int. Cl.
    *H01L 21/67* (2006.01)

(52) U.S. Cl.
    CPC ....... *H01L 21/67201* (2013.01); *Y10S 414/139* (2013.01)

(58) Field of Classification Search
    CPC .............. H01L 21/67; H01L 21/67201; H01L 21/67772
    USPC .................................. 414/217, 939
    See application file for complete search history.

(56) References Cited

U.S. PATENT DOCUMENTS

| | | | | |
|---|---|---|---|---|
| 5,002,010 A | * | 3/1991 | Weinberg | 118/719 |
| 5,169,272 A | * | 12/1992 | Bonora et al. | 414/217.1 |
| 6,436,249 B1 | | 8/2002 | Patton et al. | |
| 6,485,248 B1 | * | 11/2002 | Taylor, Jr. | 414/672 |
| 6,530,732 B1 | * | 3/2003 | Theriault et al. | 414/217 |
| 7,682,454 B2 | * | 3/2010 | Sneh | 118/719 |
| 7,976,635 B2 | * | 7/2011 | Kurita et al. | 118/724 |
| 8,252,116 B2 | * | 8/2012 | Sneh | 118/715 |
| 2004/0083955 A1 | * | 5/2004 | Ramsay | 118/500 |
| 2013/0153462 A1 | * | 6/2013 | Hara | 206/711 |
| 2013/0162117 A1 | * | 6/2013 | Hara et al. | 312/31 |

* cited by examiner

*Primary Examiner* — Kaitlin Joerger

(57) ABSTRACT

A load lock having a reduced volume, thereby allowing faster pumping and venting, is disclosed. The load lock uses a movable bottom wall to modify the volume of the chamber to be pumped. In a first position, the movable wall is disposed so as to create a small internal volume. In a second position, the bottom wall is moved downward, allowing the workpiece to be in contact with a process chamber or an exit aperture. The bottom wall may be sealed in the first position through the use of a sealing mechanism, such as a magnetic clamp. The bottom wall may also include a workpiece holding mechanism. The top wall may be a removable cover, which is moved by an actuator. A robotic mechanism may supply workpieces to the load lock while the top wall is in the open position.

17 Claims, 19 Drawing Sheets

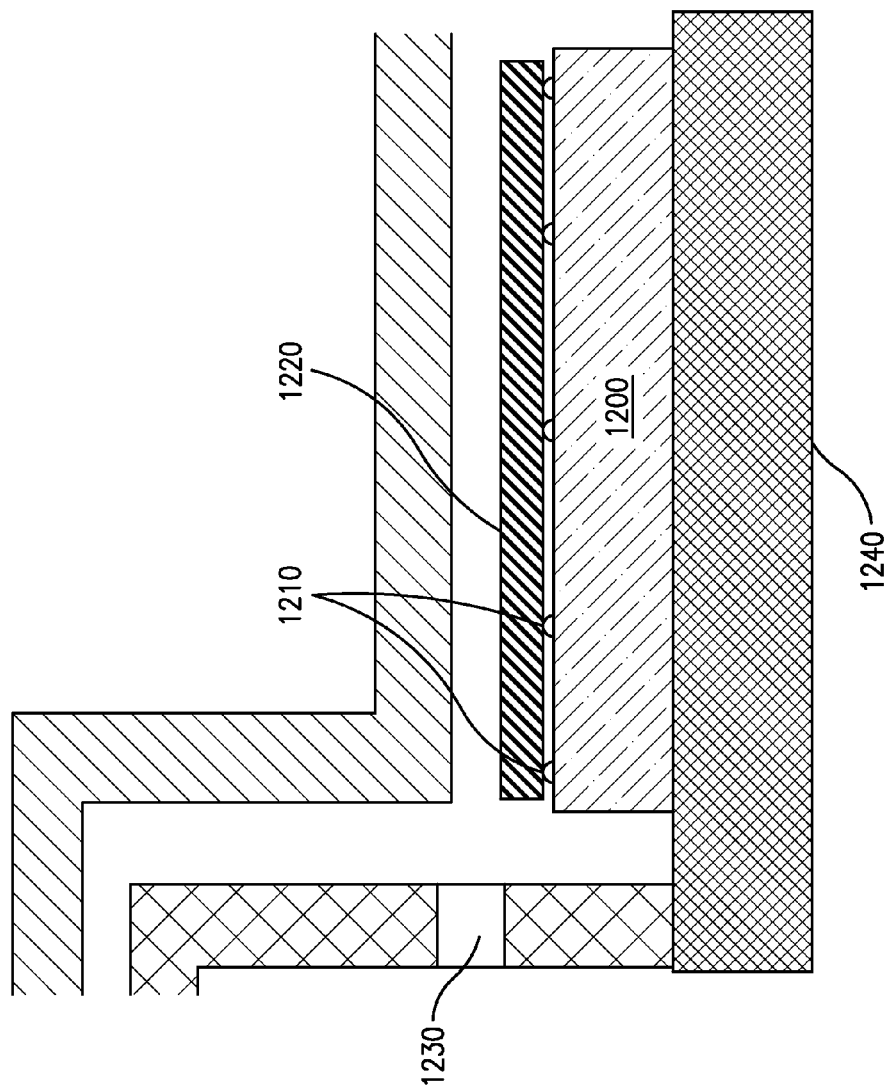

HIGH THROUGHPUT, LOW VOLUME CLAMSHELL LOAD LOCK

Embodiments of the present invention relate to methods and apparatus for providing a load lock having a small volume, thereby allowing high throughput during pump-down and vent up operation.

BACKGROUND

Workpieces, such as semiconductor wafers or solar cells, are processed within process chambers. Workpieces are typically moved from one chamber to another by automated means. Often, each chamber must be environmentally isolated from other chambers. Consequently, the workpieces are typically moved between chambers by the use of load locks. These load locks serve to isolate a particular chamber from its outside environment. Additionally, a difference in pressure may exist on either side of the load lock. For example, near vacuum conditions may exist within the chamber, while the outside environment may be at standard atmospheric pressure. Thus, the load lock must also seal the chamber against these differences in pressure.

Load locks are used to move a workpiece from one environment to a second environment. Typically, the parameters of these two environments are different. In some embodiments, one of these two environments may be at standard pressure, while the second environment is at a much reduced pressure, such as near vacuum conditions. In some embodiments, the second embodiment has a pressure in the order of several milliTorr. For purposes of this disclosure, pressures of less than 1 Torr are referred to as vacuum conditions.

The walls of the load lock define an internal chamber, which can be isolated from both environments. The load lock includes an entry aperture, in communication with the first environment, through which workpieces may be introduced. In addition, the load lock includes an exit aperture, in communication with the second environment, through which workpieces may be extracted. The entry aperture may be an opening in one of the walls, which may be sealed by a movable door or other type of slit valve. Similarly, the exit aperture may also be an opening in one of the walls. In other embodiments, the entry or exit aperture may be incorporated into some other feature.

In operation, the load lock begins in a state where the exit aperture is closed, thereby separating the internal chamber from the second environment. The entry aperture is opened and a workpiece is placed within the chamber through the entry aperture. Typically, a mechanical apparatus, such as a robotic mechanism is used to place the workpiece in the load lock. The mechanical apparatus is removed, leaving behind the workpiece. The entry aperture is then closed, thereby sealing the internal chamber from the first environment. Typically, after the entry aperture is closed, the load lock is brought to, or near, the barometric conditions of the second environment through the introduction or exhaustion of air from the chamber. Once this operation is completed, the exit aperture is then opened and the workpiece is transferred through the exit aperture to the second environment, typically through the use of a second robotic mechanism.

Most load lock chambers have a significant volume, as it is necessary for these robotic mechanisms to reach inside the chamber to introduce and remove the workpiece. Consequently, since the volume is relatively large, the time required to remove the air from the chamber, or "pump down" the chamber, until it reaches vacuum conditions, may be significant and impact overall throughput of the processing equipment.

Therefore, it would be beneficial if there were a load lock which had a much smaller volume, thereby allowing higher throughput through the semiconductor manufacturing and handling process.

SUMMARY

A load lock having a reduced volume, thereby allowing faster pumping and venting, is disclosed. The load lock uses a movable bottom wall to modify the volume of the chamber to be pumped. In a first position, the movable wall is disposed so as to create a small internal volume. In a second position, the bottom wall is moved downward, allowing the workpiece to be in contact with a process chamber or an exit aperture. The bottom wall may be sealed in the first position through the use of a sealing mechanism, such as a magnetic clamp. The bottom wall may also include a workpiece holding mechanism. The top wall may be a removable cover, which is moved by an actuator. A robotic mechanism may supply workpieces to the load lock while the top wall is in the open position.

In one embodiment, a load lock comprises a top wall; a bottom wall configured to hold a workpiece; a plurality of side walls, wherein the top wall, the bottom wall and the side walls define an upper chamber; a valve in communication with the upper chamber and in communication with a pump to extract air from the upper chamber; a first actuator to move the top wall between a first open position and a second closed position; and a second actuator in communication with the bottom wall to move the bottom wall between a first position, where the bottom wall, the side walls and the top wall form a sealed upper chamber, and a second position, lower than the first position.

In another embodiment, a method of transferring a workpiece from a first environment at a first pressure to a second environment at a second pressure, lower than the first pressure, using a load lock having a top wall, a bottom wall, and a plurality of side walls, defining an upper chamber is disclosed. The method comprises opening the top wall, while the bottom wall is in a first position; loading the workpiece into the upper chamber; replacing the top wall so as to form a sealed upper chamber; extracting air from the upper chamber; and lowering the bottom wall to a second position, to expose the workpiece to the second environment.

In another embodiment, the load lock comprises a top wall, having a recessed central portion and a lip surrounding the recessed central portion; a wafer lift, disposed in the top wall having a plurality of shelves configured to hold a workpiece; a bottom wall; a plurality of side walls, wherein the top wall, the bottom wall and the side walls define an upper chamber; a valve in communication with the upper chamber and in communication with a pump to extract air from the upper chamber; a first actuator to move the top wall between a first open position and a second closed position, where the recessed central portion extends into a volume defined by the side walls and the bottom wall and the lip rests on a top surface of the side walls; a second actuator in communication with the bottom wall to move the bottom wall between a first position, where the bottom wall is sealed against the side walls, and a second position, where the bottom wall is not sealed against the side walls; and a third actuator in communication with the shelves to move the shelves between a first position where a robotic mechanism may access the workpiece, and a second position where the workpieces are proximate the underside of the recessed central portion.

BRIEF DESCRIPTION OF THE FIGURES

For a better understanding of the present disclosure, reference is made to the accompanying drawings, which are incorporated herein by reference and in which:

FIG. 12 shows a third embodiment of a workpiece holding mechanism to hold workpieces in place during pumping;

DETAILED DESCRIPTION

Figure 1A:
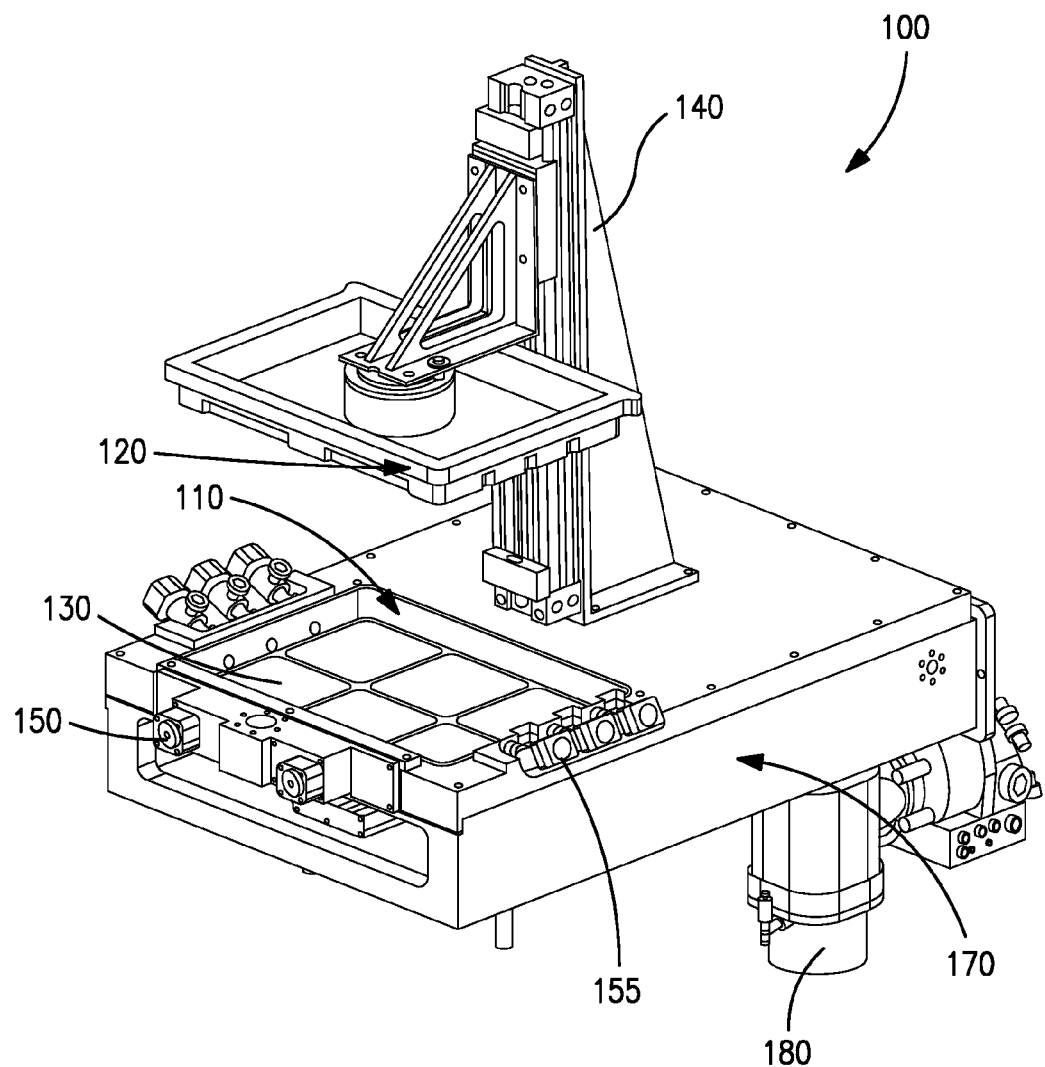
FIG. 1A shows a first embodiment of a load lock in an open position.
Figure 1B:
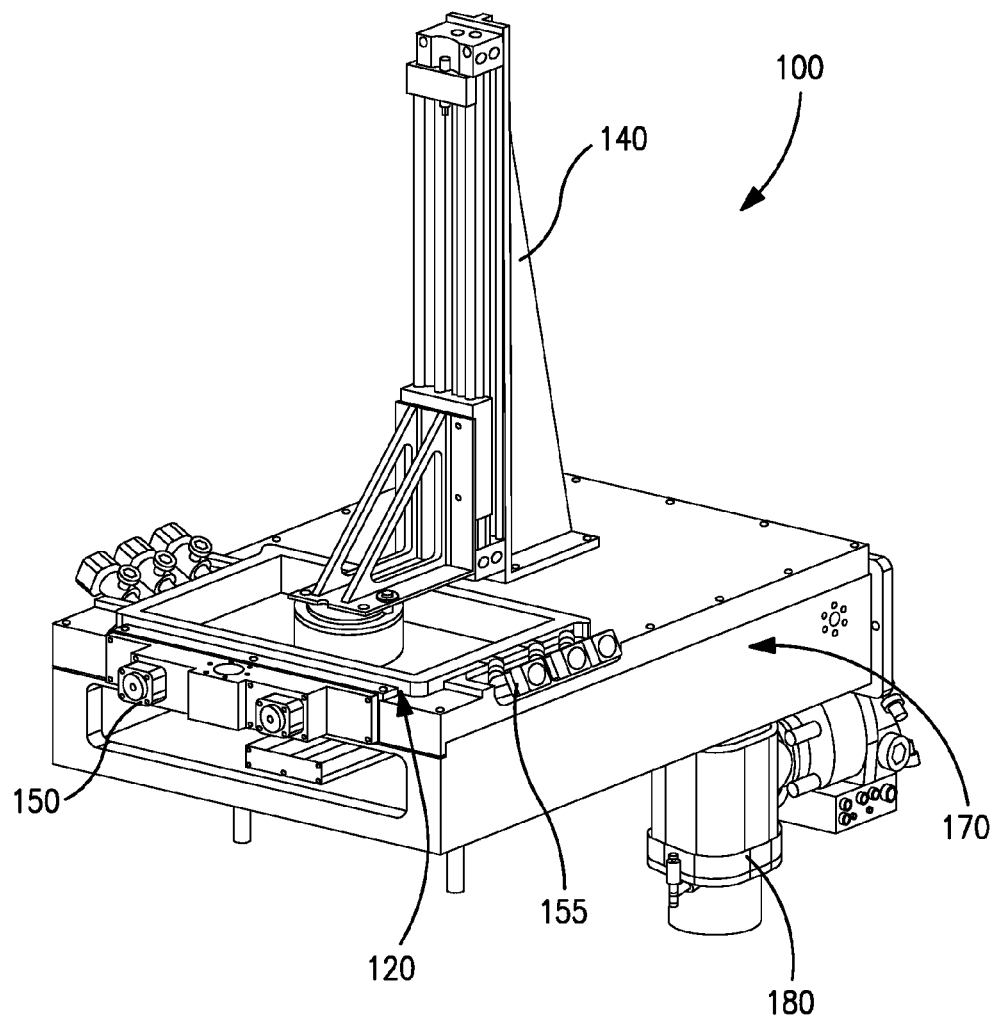
FIG. 1B shows the load lock of FIG. 1A in the closed position.

FIGS. 1A-B show a first embodiment of a load lock 100. In this embodiment, the load lock includes an upper chamber 110, comprising a plurality of walls. In this embodiment, the top wall 120 is removable and is attached to a top cover actuator 140, which raises and lowers the top wall 120. When in the open position, shown in FIG. 1A, a robotic mechanism (not shown) may load one or more workpieces 130 into the upper chamber 110. In the embodiment of FIG. 1A, six workpieces 130 are loaded, though other numbers or configurations of workpieces 130 are possible. The top wall 120 thus serves as an entry aperture. The load lock 100 also includes one or more valves to exhaust or introduce air into the upper chamber 110. In this embodiment, horizontal poppet valves 150 are located along one side of the load lock 100. Angled valves 155 are located along two sides of the load lock 100. In other embodiments, only one type of valve may be in communication with the upper chamber 110. These valves 150, 155 may be in communication with a vacuum pump, turbo pump or other pump (not shown) to extract air from the upper chamber 110.

Figure 2:
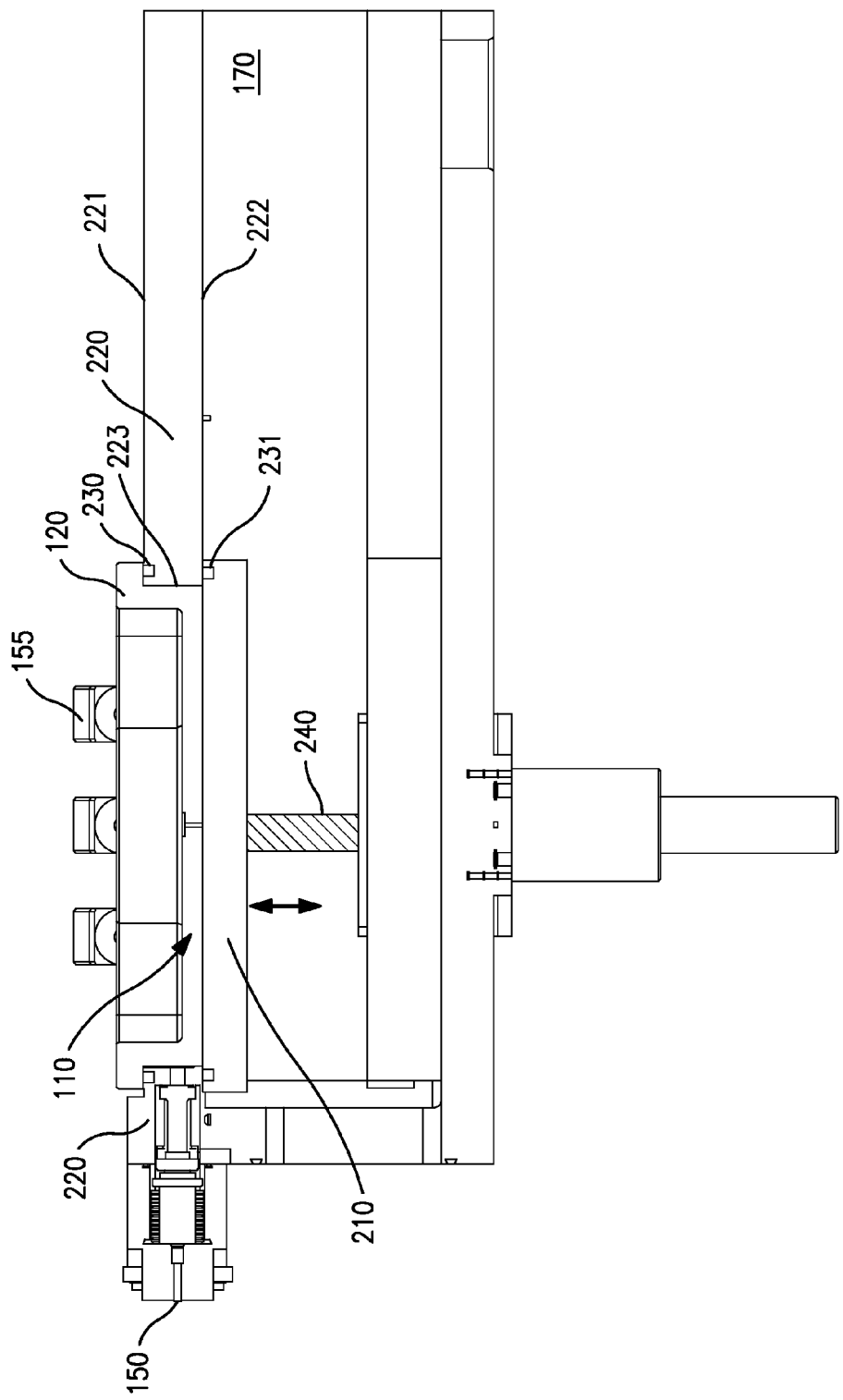
FIG. 2 is a cross sectional view of the load lock of FIG. 1B.

In this embodiment, the load lock 100 is in communication with a second chamber 170 (see FIG. 2). This second chamber 170 may be a transfer chamber, or may be a process chamber. A vacuum pump 180 is also shown, which may hold the second chamber 170 at vacuum conditions. FIG. 1B shows the load lock of FIG. 1A with the top wall 120 lowered, thereby sealing the upper chamber 110 from the outside environment.

In operation, according to one embodiment, a robotic mechanism (not shown) moves one or more workpieces 130 over the upper chamber 110 while the top wall 120 is lifted, as shown in FIG. 1A. Pins (not shown) may extend upward from the bottom wall 210 (see FIG. 2) to provide a surface onto which the workpiece 130 may be placed. The robotic mechanism then moves away, leaving the workpiece 130 supported by the pins. The pins are then retracted, moving the workpiece 130 into the upper chamber 110. The top wall 120 is then lowered, as shown in FIG. 1B. The air can then be pumped out of the upper chamber 110 through the valves 150, 155 using a pump. According to another embodiment, the robotic mechanism comprises a vacuum suction mechanism, such that the workpieces 130 are suspended from the suction mechanism. In this embodiment, the robotic mechanism simply moves the workpieces 130 to the desired position on the bottom wall 210 and releases the vacuum seal, allowing the workpieces 130 to disengage from the vacuum suction mechanism and rest on the bottom wall 210.

FIG. 2 shows a cross section of the load lock 100 of FIG. 1B. The upper chamber 110 includes a movable bottom wall 210, which separates the upper chamber 110 and the second chamber 170. The exterior of the load lock 100 may include a surface 220, which surrounds the entry aperture into which the movable top wall 120 rests. The surface 220 has an upper side 221, a lower side 222 and side surfaces 223. In this embodiment, the top wall 120 has a recessed central portion and a lip surrounding the recessed central portion, such that the points at which the top wall 120 (i.e. the lip) meets the upper side 221 of surface 220 of the load lock 100 are higher than the bottom of the top wall 120. In other words, the upper chamber 110 is formed by the movable bottom wall 210 and side walls 223, which are formed by the thickness of the surface 220. This upper chamber 110 is filled by the recessed central portion of top wall 120, while the lip of the top wall 120 rests on the upper side 221 of the surface 220. Stated differently, when in the open position, as shown in FIG. 1A, the side surfaces 223 and the movable bottom wall 210 form an open volume. The top wall 120, and specifically, its recessed central portion, fills at least a portion of this volume, as the recessed central portion extends below the plane defined by the upper side 221 and into the open volume. The valves 150, 155 may extend through the side surfaces 223 to allow the upper chamber 110 to be vented or pumped down. Seals 230 allow a seal to be created between the top wall 120 and the upper side 221 of surface 220.

The movable bottom wall 210, as shown in FIG. 2, is pressed against the lower side 222 of the surface 220. This vacuum seal may be provided through the use of seals 231. The movable bottom wall 210 may be in a first position, shown in FIG. 2, where the movable bottom 210, the top wall 120 and the sidewalls 223 form a sealed upper chamber 110. The movable bottom wall 210 is moved by an actuator 240, which extends from the bottom of the second chamber 170 to the movable bottom wall 210. After the air is exhausted from the upper chamber 110 such as by a pump, the bottom wall 210 can be moved to a second position. Since the workpiece 110 is supported by the movable bottom wall 210, the workpiece 110 also moves when the bottom wall 210 is moved. In FIG. 2, the bottom wall 210 moves downward to the lower level of the second chamber 170. In this embodiment, the downward movement of movable bottom wall 210 serves to unite the upper chamber 110 and the second chamber 170. Thus, the moveable bottom wall 210 may serve as the exit aperture of the load lock 100. In one embodiment, the second chamber 170 is a process chamber and the workpiece 130 can then be processed in this second chamber 170. In another embodiment, the second chamber 170 is a transfer chamber and the workpiece 130 is then transferred to another chamber, such as by the use of a robotic mechanism.

Figure 5:
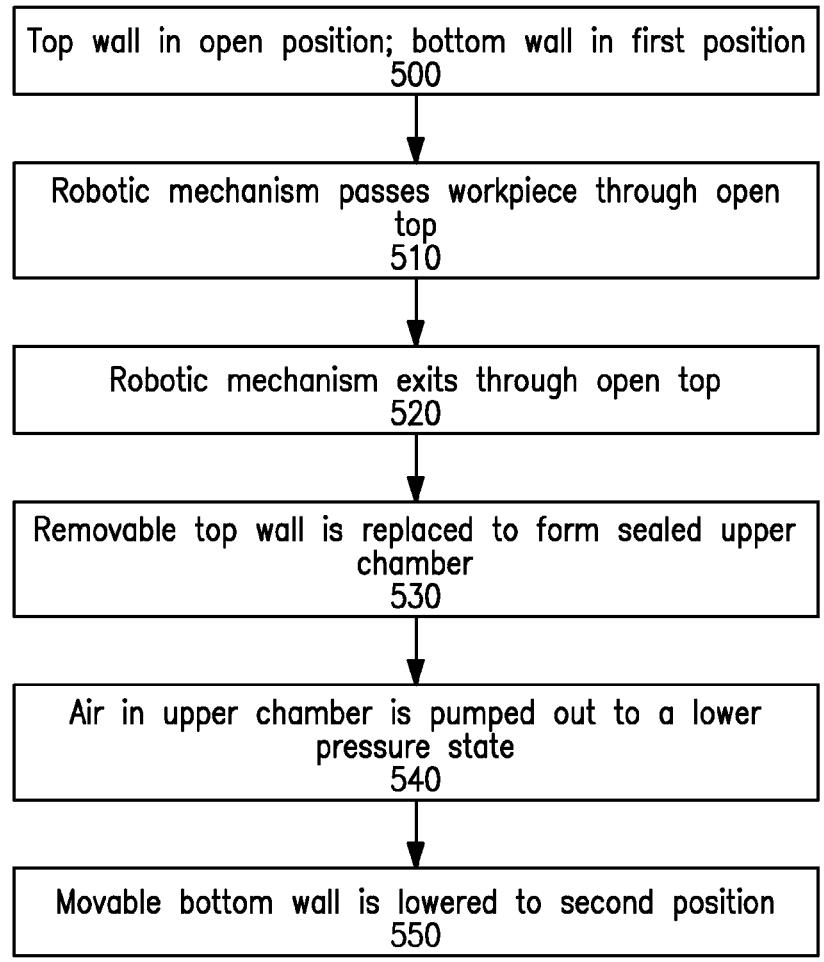
FIG. 5 represents a flowchart showing a process of transferring a workpiece from one environment to a second environment using the load lock of FIG. 1A.

FIG. 5 shows a flowchart of this process. These steps may be executed by a controller having a processing unit, executing computer readable instructions. These computer readable instructions are stored in a memory device which is in electrical communication with processing unit. The controller executes these instructions to perform the steps described in this disclosure. The controller (not shown) may be in communication with the actuator 240 used to move the movable bottom wall 210. The controller may also be in communication with the pump used to remove air from the upper chamber 110, as well as the top cover actuator 140 used to remove and replace top wall 120. First, in step 500, the removable top wall 120 is raised, allowing access to the top of the load lock 100. This may be performed by a top cover actuator 140, as shown in FIGS. 1A-1B. FIG. 1A also shows the open top of the load lock 100, which is exposed when the top wall 120 is removed. During this step, the movable bottom wall 210 is in a first position, pressed against the lower side 222 of the surface 220. A robotic mechanism then places a workpiece 130 in the upper chamber 110 through the open top, as shown in step 510. This can be achieved using a robotic mechanism having a vacuum end effector, where the end effector places the workpiece in the upper chamber 110 and then removes the vacuum. In another embodiment, the movable bottom wall 210 has pins which can be extended upward to allow the workpiece to be placed on the pins by the robotic mechanism. The robotic mechanism is then removed, as shown in step 520. Steps 510 and 520 may be repeated if multiple workpieces need to be placed. The removable top wall 120 is then lowered, by moving top cover actuator 140, creating a sealed upper chamber 110 in the load lock 100, as shown in step 530. Air in the upper chamber 110 is then pumped out through the valves 150, 155 until an acceptable pressure is reached, as shown in step 540. In some embodiments, this pressure is the same as that of the second chamber 170. In other embodiments, due to limited impact of the small volume of upper chamber 110 on the larger volume of the second chamber 170, the pressure achieved in the sealed upper chamber may be greater than that of the second chamber 170. At this point, the movable bottom wall 210 is lowered to a second position, thereby moving the workpiece 130 into the second chamber 170, as shown in step 550.

When the workpiece 130 is to be returned to the first environment, the process described above is reversed. The workpiece 130 is moved to the movable bottom wall 210. The movable bottom wall 210 is then lifted, so as to form the lower sealing wall of the upper chamber 110. In some embodiments, a mechanical actuator 240, such as an air cylinder, is used to lift the movable lower wall 210 into place. The movable bottom wall 210 may be sealingly held in place against the lower side 222 of surface 220 in any number of ways.

Figure 3:
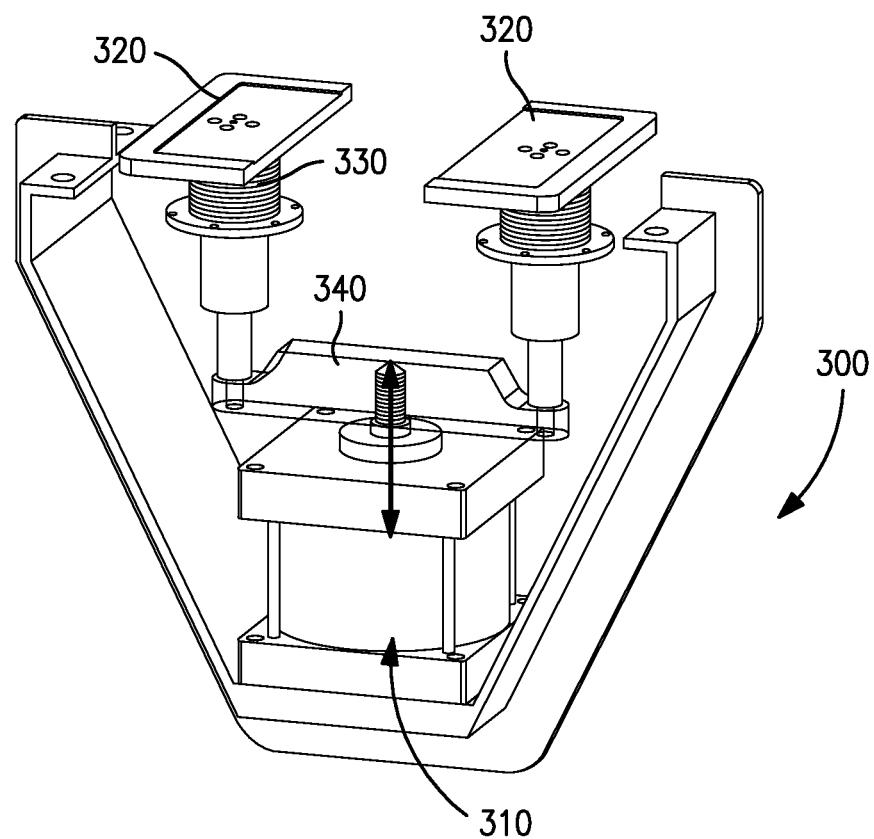
FIG. 3 is a view of an actuator that may be used to move the movable lower wall of FIG. 2.

Various mechanisms may be used to move the movable bottom wall 210. For example, FIG. 3 shows an actuator 300 which can be used to raise and lower the lower wall 210. This actuator includes an air cylinder 310, which can be extended and retracted. Disposed on the distal end of the air cylinder is a bracket 340, which is used to distribute the force across the surface area of the bottom wall 210. Attached to the bracket 340 is a plurality of supports 320. These supports 320 may be disposed on a biasing member 330. This actuator 300 may be used to press the movable bottom wall 210 against the lower side 222 of the surface 220 of the upper chamber 110 to create a vacuum seal and to resist the force of atmosphere.

In other embodiments, other mechanisms may be used to hold the movable lower wall 210 in place. For example, magnetically attractive material may be disposed on the lower side 222 of the surface 220 of the upper chamber 110. An electrically switchable magnet, such as an electrically switchable permanent magnet, may be disposed in the movable bottom wall 210. When the movable bottom wall 210 is pressed against the lower side 222 of surface 220, the electrically switchable permanent magnet is energized, which serves to hold the movable bottom wall 210 against the lower side 222. In another embodiment, the electrically switchable permanent magnet is disposed in the lower side 222 of the surface 220 and the movable bottom wall 210 has the magnetically attractive material. This magnetic clamping system may be used in combination with a second actuation system. For example, a pneumatic or hydraulic actuation system may be combined with the magnetic clamping system. Of course, other mechanisms to move the movable bottom wall 210 and hold it against the lower side 222 of surface 220 may also be employed. In addition, other mechanisms, such as electro hydraulic systems may be used to implement the actuator 300.

Once the movable bottom wall 210 is sealed in place, the upper chamber 110 may be brought to the barometric condition of the first environment. In other embodiments, there may be no need to change the pressure within the upper chamber 110 before opening the top wall 120. The top wall 120 is then lifted by top cover actuator 140, which equalizes the pressure between the first environment and the upper chamber 110. The robotic mechanism can then remove the workpiece 130 from the upper chamber 110.

Stated differently, the movable bottom wall 210 serves as an exit aperture for the load lock 100. However, it may serve other functions as well. Load locks traditionally have a large volume due to the need to insert and remove robotic mechanisms therefrom. A movable bottom wall 210 may be used to allow the volume of the upper chamber 110 of the load lock 100 to be a first value when a workpiece is being introduced to or removed from the load lock. Movement of the movable bottom wall 210 allows the volume of the upper chamber 110 of the load lock 100 to be a second, smaller volume when the load lock is being pumped down. In one embodiment, the height of the upper chamber 110 is about 0.030 inches greater than the thickness of the workpiece 130 disposed in the upper chamber 110.

FIGS. 14A-14D show another embodiment of the load lock 1400. In this embodiment, like that of FIG. 2, the top wall 1410 has a recessed central portion 1411, which extends into the volume defined by the bottom wall 1420 and the side walls 1430. As described above, an actuator 1440 is used to move the bottom wall 1420 between the sealed first portion, shown in FIG. 14A and the second open position, shown in FIG. 14D. The bottom wall 1420 may be sealed against the side walls 1430 using any of the mechanisms described above, such as a magnetic clamp. Furthermore, a second chamber 1450 is disposed below the upper chamber, such that the bottom wall 1420, when in the first sealed position, separates the upper chamber from the second chamber 1450. This second chamber 1450 may be a transfer chamber or a process chamber.

In this embodiment, a wafer holder 1470 is disposed in the top wall 1410. This wafer holder 1470 has a plurality of shelves 1471, on which the workpieces 130 are disposed. These shelves 1471 are in communication with a wafer lift actuator (not shown), and are movably attached to the top wall 1410, such that the shelves 1471 may move relative to the top wall 1410. As described above, the top wall 1410 is in communication with a top cover actuator (not shown) to move between a first open position, shown in FIG. 14A, and a second closed position, shown in FIG. 14C. In some embodiments, the wafer lift actuator and the top cover actuator may be an integral unit.

Figure 14A:
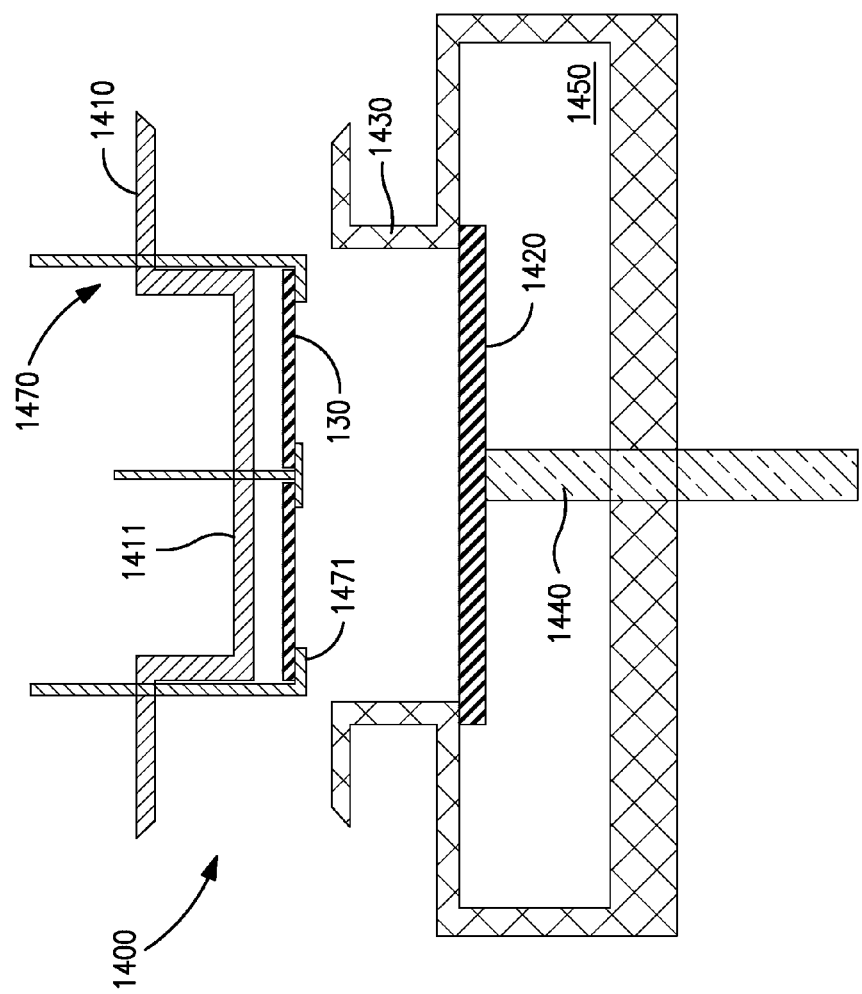
FIGS. 14A-D show another embodiment of a load lock in various stages of operation.

FIG. 14A shows the position of the top wall 1410 where a workpiece 130 may be loaded or unloaded from the wafer holder 1470. The shelves 1471 are moved to a first position relative to the top wall 1410 so that there is a gap between the workpiece 130 and the underside of the recessed central portion 1411. A robotic mechanism (not shown) may be used so as to lift the workpieces 130 off the shelves 1471 and move them away while in this first position. A new workpiece can then be placed on the shelves 1471.

Figure 14B:
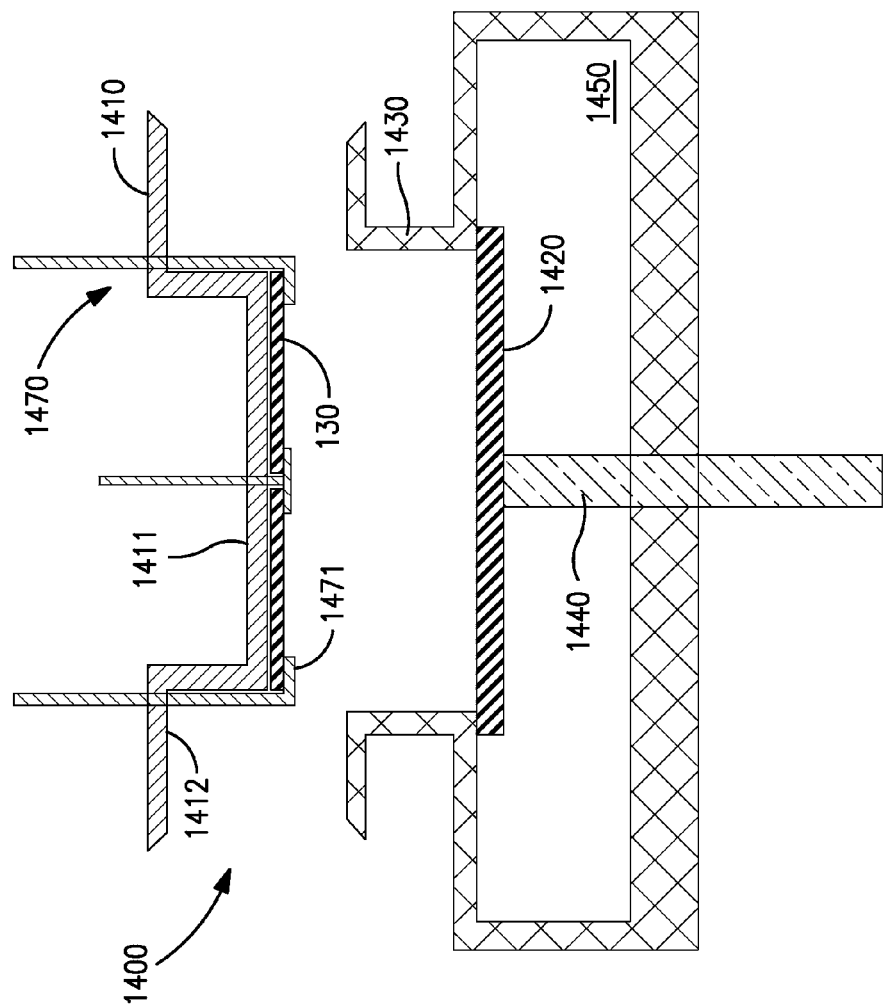

Once a workpiece, or a plurality of workpieces, 130 have been disposed on the shelves 1471, the wafer lift actuator lifts the shelves 1471 toward the underside of the recessed central portion 1411, to a second position, where the workpieces are proximate the underside, as shown in FIG. 14B.

Figure 14C:
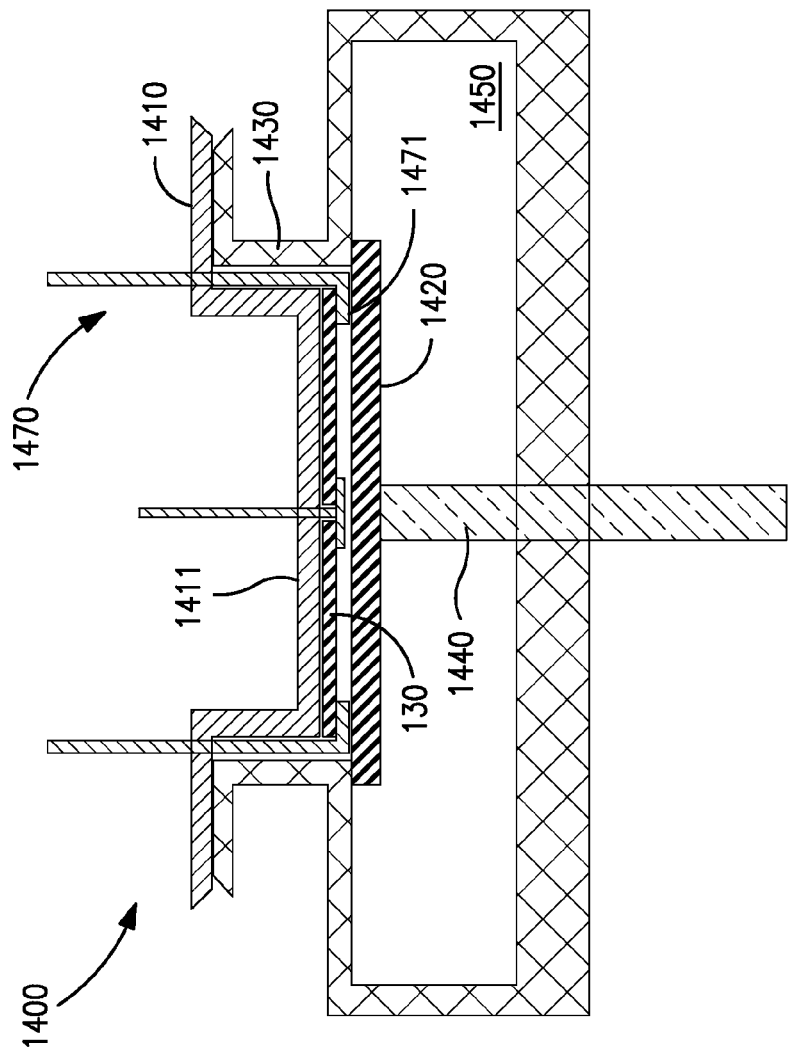

The top wall 1410, along with the workpieces 130 and the wafer lift 1470, is then moved downward into the cavity defined by sidewalls 1430 and the bottom wall 1420 using the top cover actuator. As described above, the top wall 1410 may have a lip 1412 (see FIG. 14B), which rests on the sidewalls 1430, as shown in FIG. 14C. The top wall 1410, the side walls 1430 and the bottom wall 1420 form a sealed upper chamber, from which air can be evacuated. It is noted that the wafer lift 1470 also forms a seal with the top wall 1410.

Figure 14D:
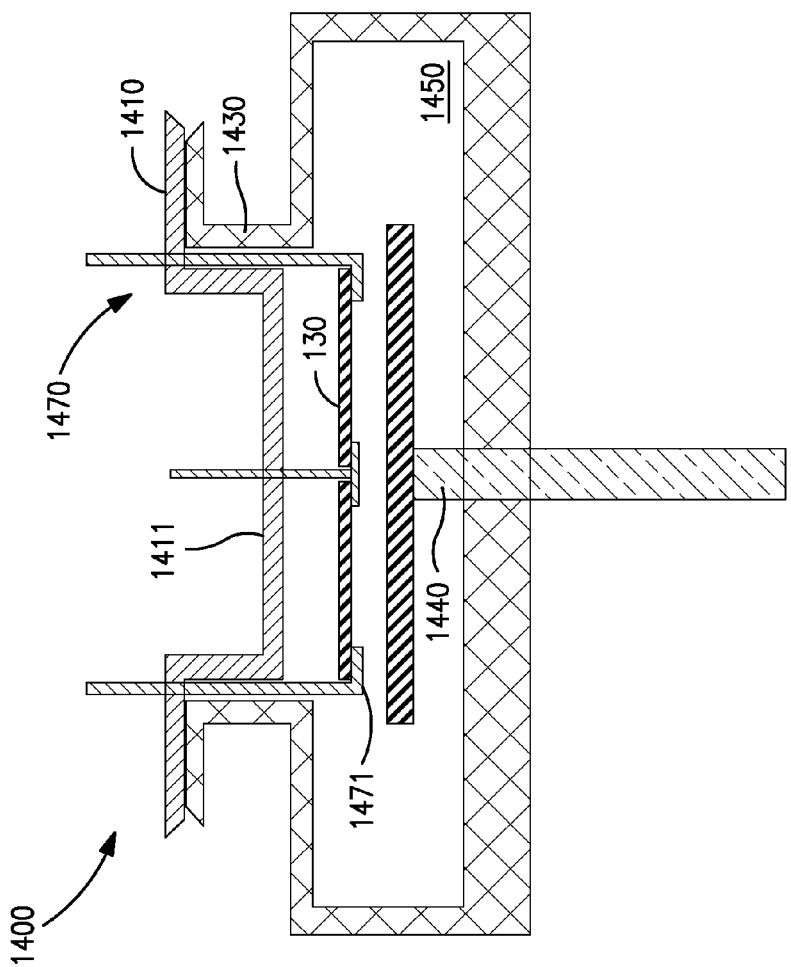

After the air in the upper chamber has been evacuated, the bottom wall 1420 may be lowered, as shown in FIG. 14D, using actuator 1440. This movement unites the upper chamber with the second chamber 1450. The wafer lift 1470 is then lowered to the first position using the wafer lift actuator. The workpieces 130 are now within the second chamber 1450 and a second robotic mechanism (not shown) can then remove the workpieces 130 from the shelves 1471.

To remove a workpiece 130 from within second chamber 1450, the steps described above are simply reversed. First the workpiece 130 is place on the shelves 1471 as shown in FIG. 14D. The wafer lift 1470 then moves upward to a second position (with no movement of the top wall 1410), until it is proximate the underside of the recessed central portion 1411. The actuator 1440 then moves the bottom wall 1420 upward until it seals with sidewall 1430, as shown in FIG. 14C. The upper chamber is now sealed from the second chamber 1450. The upper chamber can be vented to atmospheric pressure, if desired. The top wall 1410 and the wafer lift 1470 are moved together upward and are separated from the side walls 1430, as shown in FIG. 14B. The shelves 1471 are then lowered to its first position relative to the top wall 1410, so that the workpieces 130 can be accessed by a robotic mechanism.

Figure 4A:
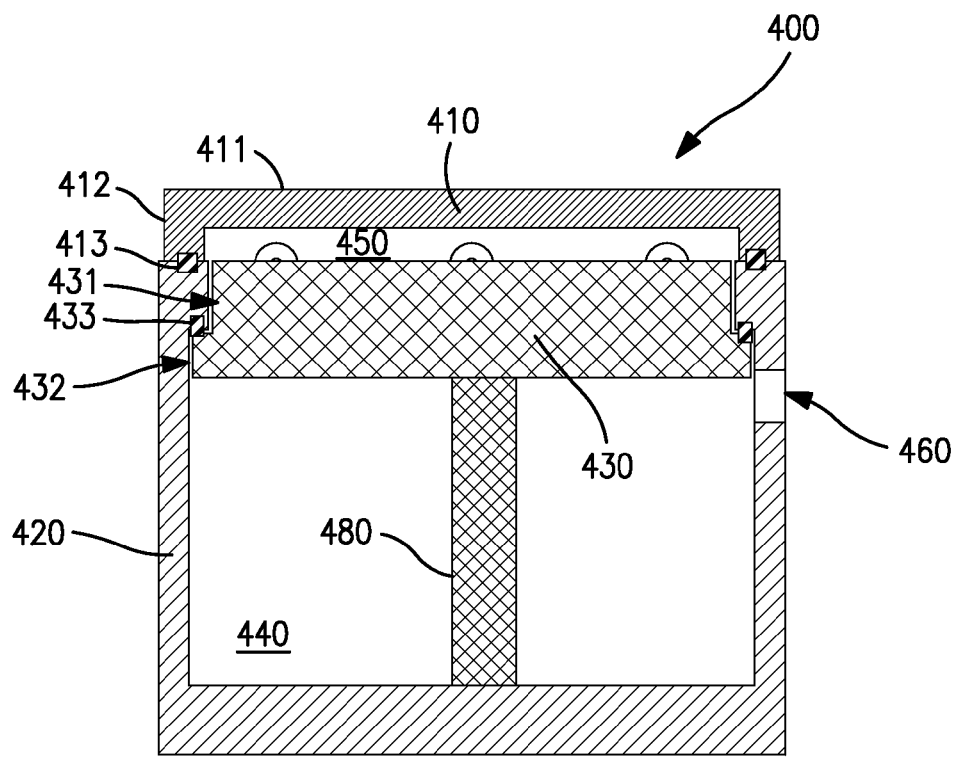
FIG. 4A-4B shows another embodiment of a load lock in different stages of operation.
Figure 4B:
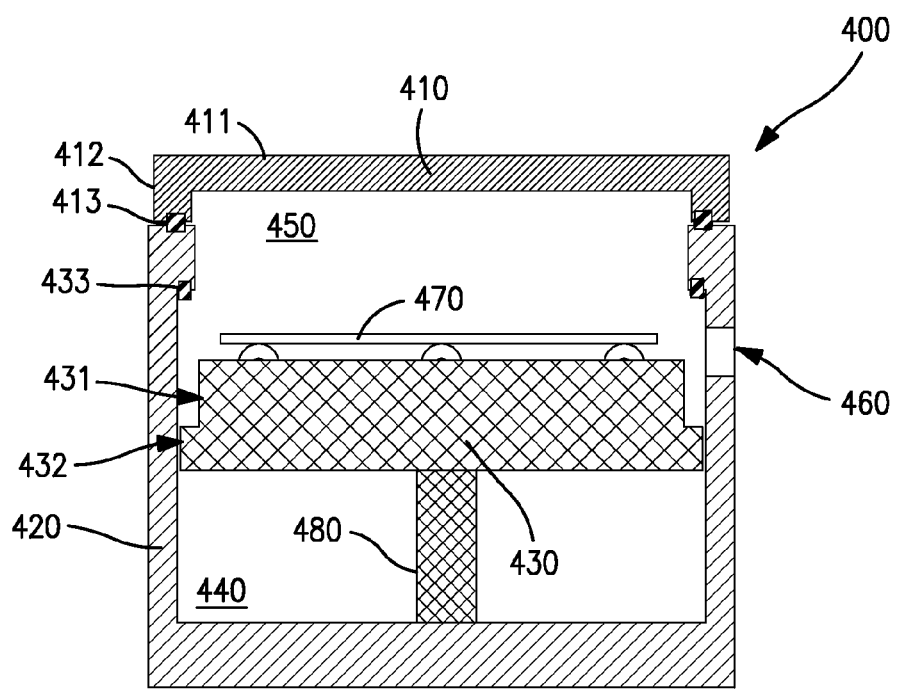

FIGS. 4A-4B shows another embodiment of a load lock 400. In this embodiment, the top wall 410 comprises a top surface 411 and side walls 412 extending downward therefrom. Thus, in this embodiment, unlike that of FIG. 1A, the central portion of the top wall 410 is above the plane defined by the top surface of the load lock body 420. The top wall 410 seals to the load lock body 420 through the use of seals 413. The seals 413 may be disposed on the side walls 412 of the top wall 410 or on the top surface of the load lock body 420. In this embodiment, valves (not shown) may be included in the top surface of the top wall 410, or some other location. The internal side walls of the load lock 420 may include a first horizontal portion. The movable bottom wall 430 may include a first portion 431, which includes the top surface that interfaces with the upper chamber 450. This first portion 431 has a first width. There is also a second portion 432 having a second width, greater than the first width, which has a bottom surface that interfaces with the lower chamber 440. The transition between the first portion 431 and the second portion 432 may create a second horizontal portion. This second horizontal portion is disposed so as to coincide with first horizontal portion. Seals 433 may be disposed on one of these horizontal portions to create a vacuum seal between the lower chamber 440 and the upper chamber 450. FIG. 4A shows the movable bottom wall 430 of the load lock 400 in the first position, where the upper chamber 450 is at its minimum volume. The actuator 480 is fully extended and allows the movable bottom wall 430 to seal against the load lock body 420. It is in this position where the chamber 450 is pumped down. The actuator 480 may be any suitable actuator, including that shown in FIG. 3, or any of the other types described above.

FIG. 4B shows the load lock 400 with the movable bottom wall 430 in a second position. In this figure, the movable bottom wall 430 is moved downward away from the top wall 410 by retracting actuator 480, thereby expanding chamber 450. The load lock body 420 may include an exit aperture 460, such as along one side of the load lock body 420. The movable bottom wall 430 is moved downward so as to expose exit aperture 460 to chamber 450, thereby allowing the workpiece 470 to be moved through the exit aperture 460.

While the disclosure describes a movable bottom wall, the disclosure is not limited to only this embodiment. For example, the top wall may be movable to allow the robotic mechanism to enter the load lock. Once the mechanism is removed, the top wall may be lowered to reduce the volume within the load lock, prior to closing the entry aperture.

Figure 6:
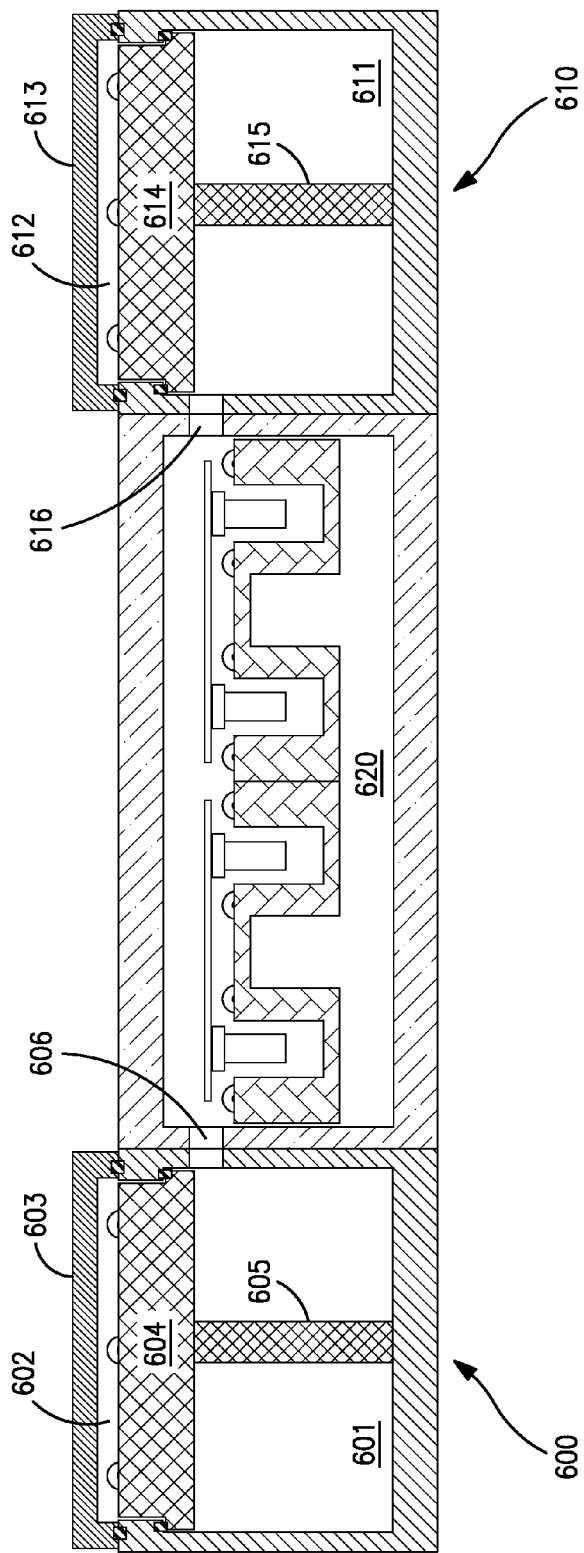
FIG. 6 shows an embodiment showing two load locks and a process chamber disposed therebetween.
Figure 7:
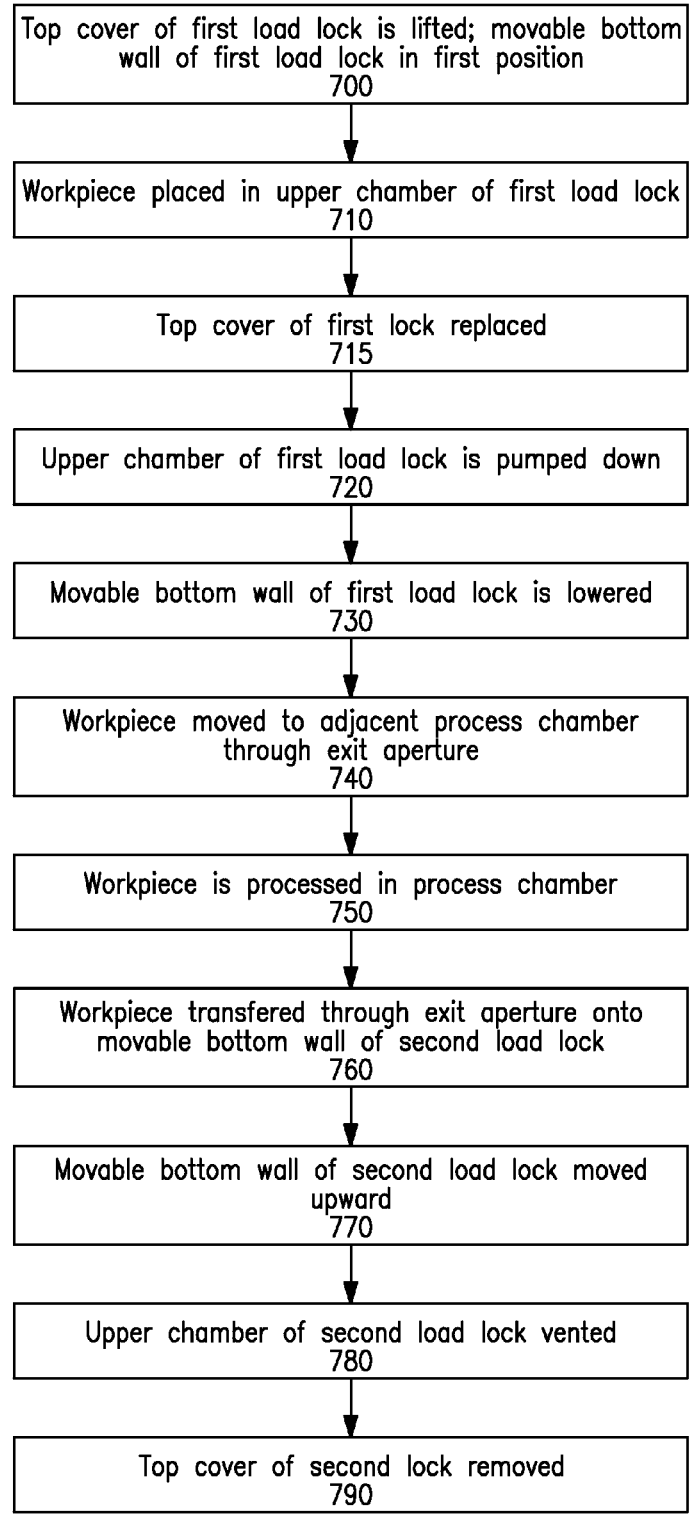
FIG. 7 represents a flowchart showing a process of transferring a workpiece from between the load locks of FIG. 6.

FIG. 6 shows an embodiment using two load locks 600, 610 from FIG. 4A-4B. Alternatively, the load lock of FIG. 1A-1B may be used. In this embodiment, a process chamber 620 is disposed between the two load locks 600, 610. The process chamber 620 is maintained at a first pressure, typically close to vacuum conditions. The external environment may be at normal atmospheric pressure. The process may be executed as follows. This process is also shown in FIG. 7. These steps may be executed by a controller having a processing unit, executing computer readable instructions. These computer readable instructions are stored in a memory device which is in electrical communication with processing unit. The controller executes these instructions to perform the steps described in this disclosure. The controller may be in communication with the actuators 605, 615, external pumps (not shown) and top cover actuators (not shown). First, as shown in step 700, the top cover 603 of load lock 600 is lifted while the movable bottom wall 604 is in its uppermost first position, thus isolating the environment above the movable bottom wall 604 (i.e. upper chamber 602) from the chamber 601. A workpiece is placed in the upper chamber 602, as shown in step 710. This may be performed using the techniques described earlier. Note that the top surface of movable bottom wall 604 may be flush with the upper surface of the load lock body, in this embodiment. The top cover 603 is then replaced by lowering the top cover actuator, as shown in step 715. The upper chamber 602 is then pumped down to near vacuum conditions, as shown in step 720. In some embodiments, the pressure in the sealed upper chamber 602 may be equal to the pressure in the process chamber 620. In other embodiments, the pressure in the sealed upper chamber 602 may be less than the external pressure, but greater than the pressure in the process chamber. Once the pressure in upper chamber 602 is sufficiently low, the movable bottom wall 604 is moved downward using actuator 605, as shown in step 730. As it is moved down, exit aperture 606 is exposed. At this point, it is possible to move the workpiece from the movable bottom wall 604 to the process chamber 620, as shown in step 740. The workpiece can then be processed in the process chamber 620, as shown in step 750. When the workpiece reaches the far end of the process chamber 620, the movable bottom wall 614 of the second load lock 610 must be in the lower position. The workpiece is then transferred through exit aperture 616 onto the movable lower wall 614, as shown in step 760. This movable lower wall 614 is then moved upward by actuating actuator 615, as shown in step 770. The upper chamber 612 may be vented to bring it back to atmospheric pressure, as shown in step 780. The top cover 613 can then be removed using a top cover actuator, as shown in step 790. While this process describes the movement of one workpiece from one load lock 600 through the process chamber 620 to another load lock 610, other embodiments are also possible. For example, it may be possible to have one workpiece entering the first load lock 600, two or more workpieces being processed in process chamber 620, while a third workpiece is exiting through the second load lock 610. The actions of movable walls 604, 614 and top covers 603, 613 may be coordinated by the controller to maximize the throughput of workpieces through the system. Additional load locks besides the load locks 600, 610 also may be added to the process chamber 620.

In another embodiment, load lock 600 may serve as both an inlet for workpieces into the process chamber 620 and an outlet for these workpieces. For example, a variation of the sequence shown in FIG. 7 may be used. After load lock 600 completes step 750, a processed workpiece (which may have entered via either load lock 600 or load lock 610) may be transferred through the exit aperture 606 to the movable bottom wall 604 of the first load lock 600. Steps 760-790 then proceed, however, it is the first load lock that is being used during these steps. In this way, the first load lock is never idle, as it moves workpieces during each pump down and vent up process. In addition, the second load lock 610 may also be performing the steps described herein, so that both load locks 600, 610 are functioning as inlets and outlets from the process chamber 620.

Figure 8B:
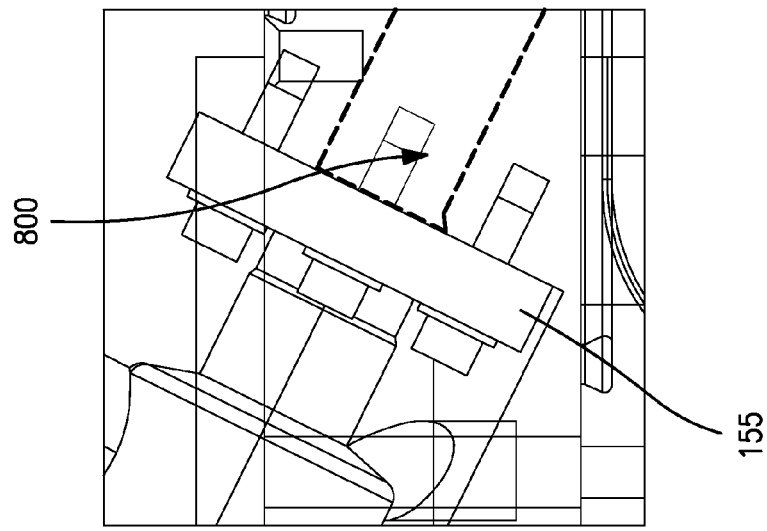
FIGS. 8A-B shows two different valves that may be used with the load lock.
Figure 8A:
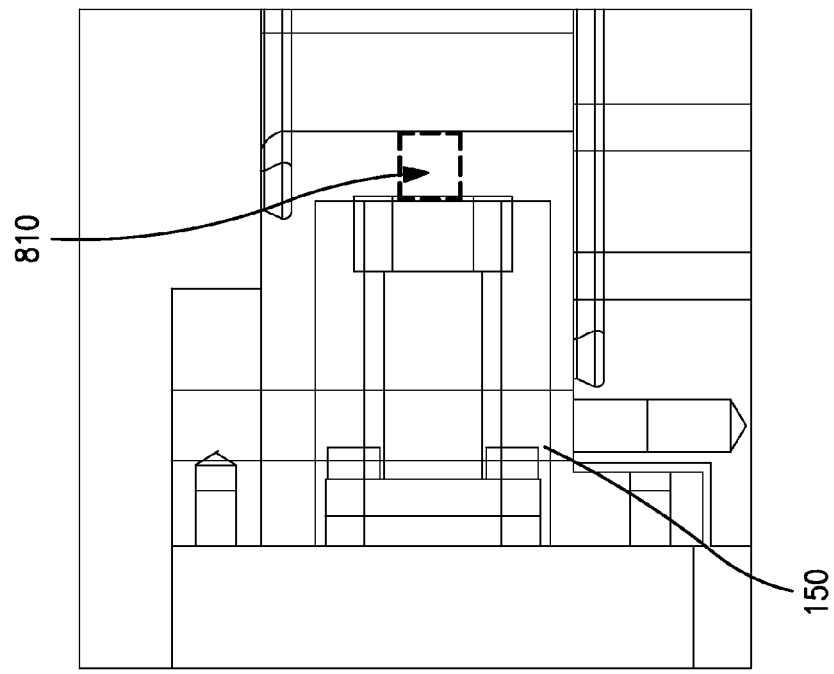

To further reduce the volume of the upper chamber, a special poppet valve may be used. FIG. 8 shows a comparison of two different valves. As shown in FIG. 8B, a conventional angled valve 155 (see FIG. 1A) may be used with the load lock 100 of FIG. 1A. This valve 155 is angled and creates a channel 800 between it and the upper chamber 110. This channel 800 comprises additional air that needs to be pumped out. In contrast, the horizontal poppet valve 150, shown in FIG. 8A, mounts horizontally on the same horizontal plane as the upper chamber 110 (see FIG. 1A), and therefore creates a much smaller channel 810.

One of the benefits of the load lock is the ability to quickly remove air trapped in the upper chamber due to the small volume of that chamber. To maximize this benefit, it may be advantageous to remove air from within the chamber as quickly as possible. However, doing so may affect the position of the workpieces in the chamber. For example, the flow of air in the upper chamber out through the vacuum ports may cause the workpieces to move.

Figure 9:
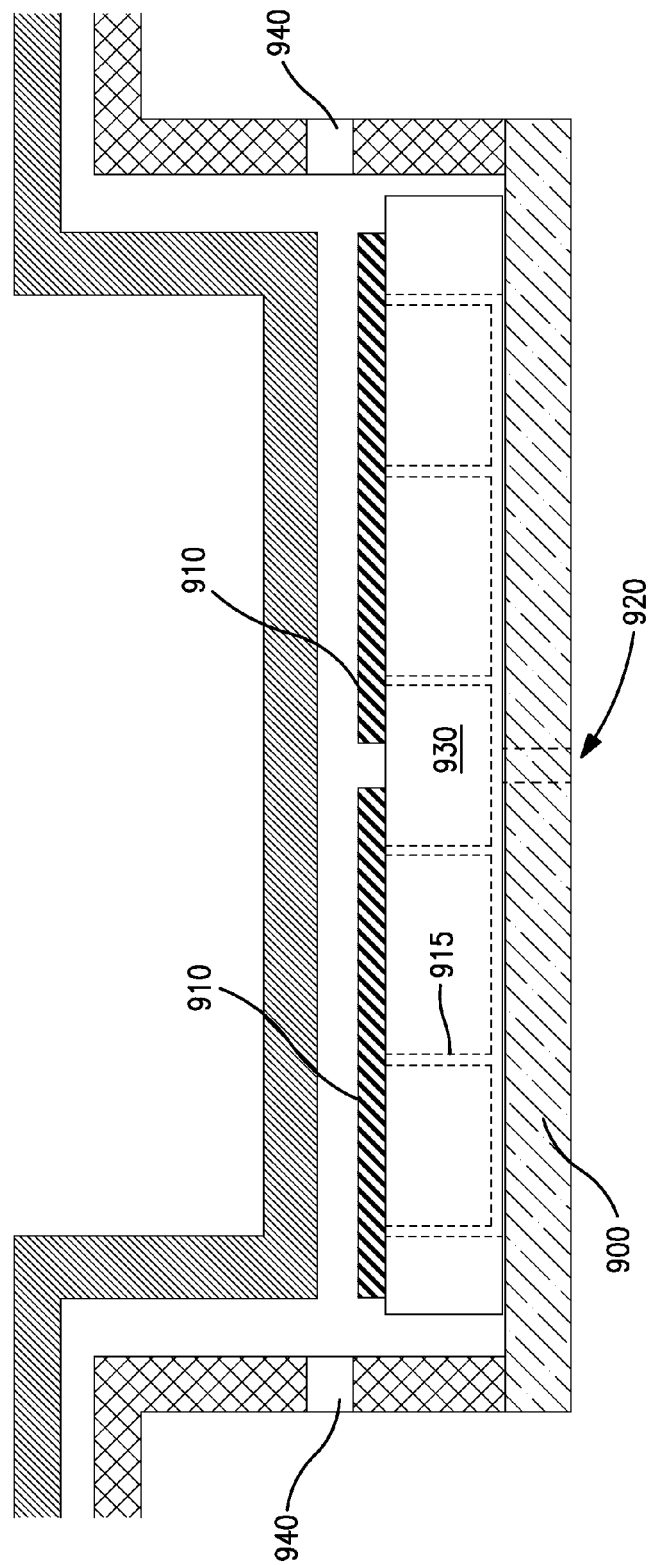
FIG. 9 shows a first embodiment of a workpiece holding mechanism to hold workpieces in place during pumping.

In some embodiments, this movement is minimized through the use of a workpiece holding mechanism. Various workpiece holding mechanisms may be utilized. In one embodiment, shown in FIG. 9, the movable bottom wall 900 includes a vacuum chuck 930 which is used to hold the workpiece 910 in place. After the workpiece 910 is placed on the movable bottom wall 900, the vacuum chuck 930 is activated, and begins drawing air through passages 915 in the chuck 930 and through the exit 920. The passages 915 in vacuum chuck 930 may be in communication with a vacuum system having tubes which extend into the lower surface of the movable bottom wall 900. In one embodiment, the tubes are coupled to the actuator which moves the movable bottom wall 900, such as that shown in FIG. 3. By holding the workpiece 910 using the vacuum chuck 930, the workpiece 910 is less apt to move as air exits through vacuum ports 940. The vacuum chuck 930 works based on differential pressure. Thus, once the air has been pumped through vacuum ports 940, the pressure above and below the workpiece 910 should be equal and the vacuum chuck 930 can be disengaged.

Figure 10:
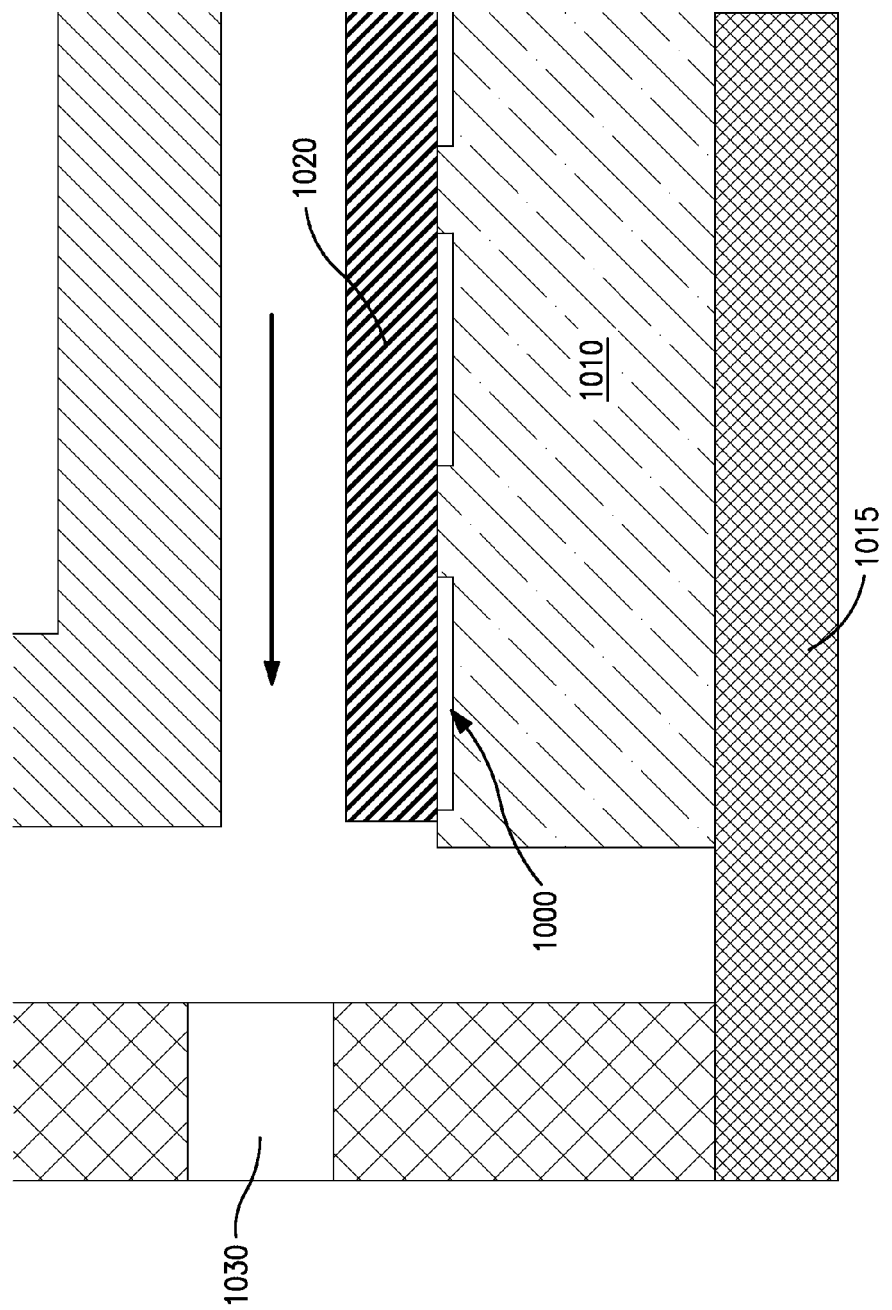
FIG. 10 shows a second embodiment of a workpiece holding mechanism to hold workpieces in place during pumping.
Figure 11B:
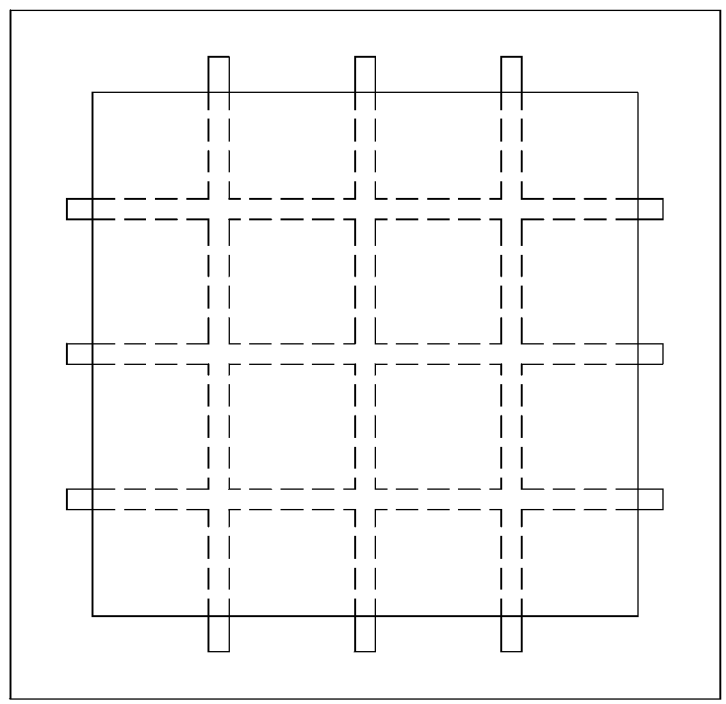
FIG. 11A-11B shows patterns that may be used with the embodiment of FIG. 10.
Figure 11A:
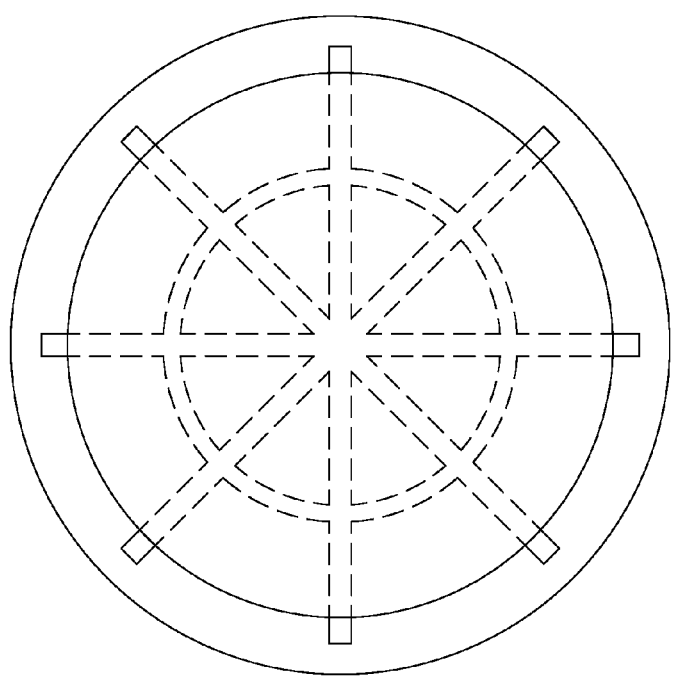

In other embodiments, movement of the workpiece is limited by attempting to balance the flow of air above and below the workpiece. Differential air flow may cause a pressure difference which could cause the workpieces to move toward the vacuum ports. One method that can be used to alleviate this is to introduce channels 1000 on the top surface of a pedestal 1010 sitting on the movable bottom wall 1015, as shown in FIG. 10. These channels 1000 create gaps between the pedestal 1010 and the underside of the workpiece 1020, which allow the flow of air from under the workpiece 1020 toward the vacuum ports 1030. FIG. 10 shows a movable bottom wall 1015 having a pedestal 1010 to raise the height of the movable bottom wall 1015. However, in other embodiments, the pedestal 1010 and the movable bottom wall 1015 may be a single unitary part. FIGS. 11A-11B show two different channel patterns that can be used to create the desired channels beneath the workpiece 1020. FIG. 11A may be for use with round workpieces, while FIG. 11B may be used with rectangular workpieces. Of course, other patterns may be used and an optimal pattern may be determined based on experimentation. Note that this embodiment may be used alone or in conjunction with the mechanisms shown in FIGS. 12 and 13.

Another way to balance the air flow between the upper side of the workpiece and the underside of the workpiece is to use small projections on the upper surface of the movable bottom wall. FIG. 12 shows a cross-sectional view of an embodiment where the upper surface of the pedestal 1200 on the movable bottom wall 1240 has a plurality of raised projections 1210. These projections 1210 serve to elevate the workpiece 1220 off the pedestal 1200 and allow the flow of air across the underside of the workpiece 1220. Air then exits through vacuum ports 1230 from both the upper side and the underside of the workpiece 1220. FIG. 12 shows a movable bottom wall 1240 having a pedestal 1200 to raise the height of the movable bottom wall 1240. However, in other embodiments, the pedestal 1200 and the movable bottom wall 1240 may be a single unitary part. Note that this embodiment may be used alone or in conjunction with the mechanisms shown in FIGS. 10 and 13.

Figure 13:
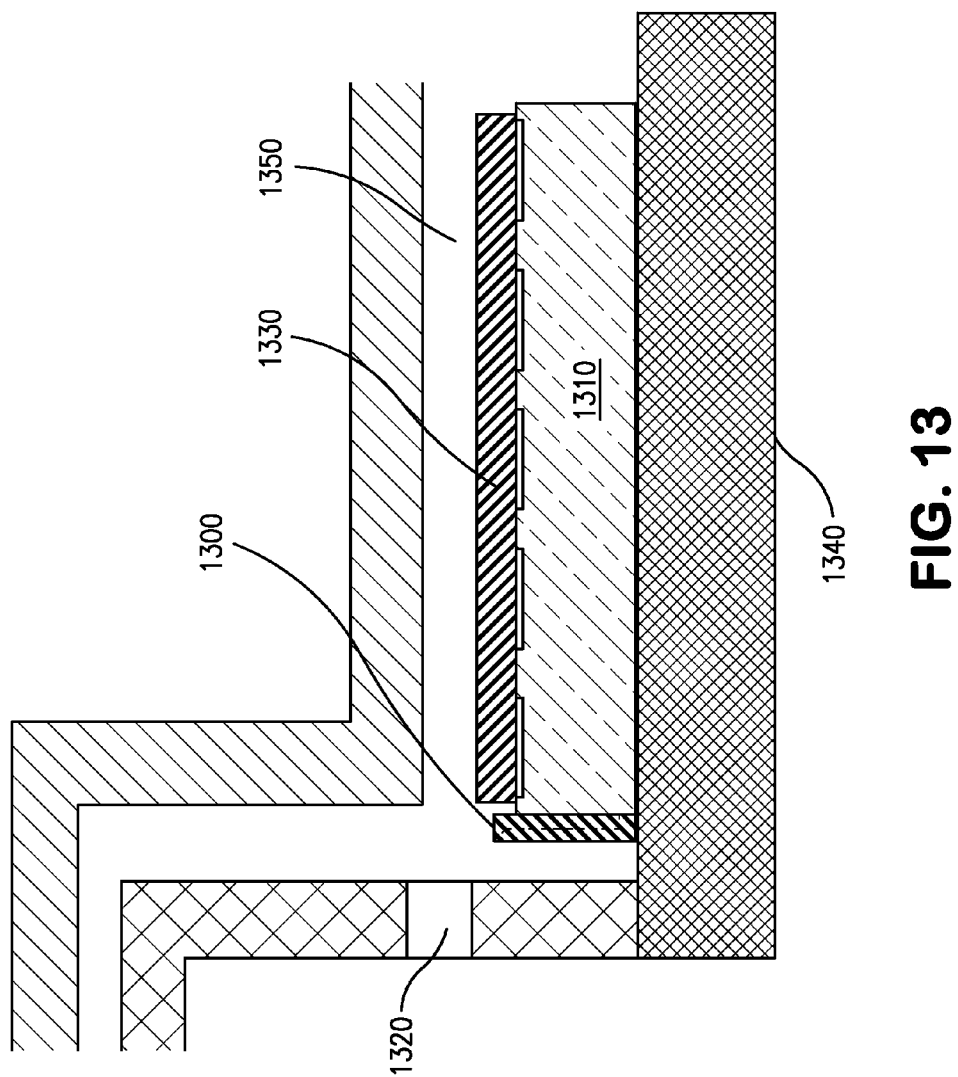
FIG. 13 shows a fourth embodiment of a workpiece holding mechanism to hold workpieces in place during pumping.

Yet another way to hold the workpiece in place is through the use of workpiece retention pins 1300, as shown in FIG. 13. In this embodiment, one or more workpiece retention pins 1300 are disposed on the pedestal 1310 of movable bottom wall 1340. These pins 1300 may be located near the vacuum ports 1320 and extend upward so as to inhibit movement of the workpiece 1330 toward the vacuum port 1320. The extent to which the workpiece retention pins 1300 extend upward may be a distance sufficient to stop movement of the workpiece 1330. FIG. 13 shows a movable bottom wall 1340 having a pedestal 1310 to raise the height of the movable bottom wall 1340. However, in other embodiments, the pedestal 1310 and the movable bottom wall 1340 may be a single unitary part. Note that this embodiment may be used alone or in conjunction with the mechanisms shown in FIGS. 10 and 12. For example, FIG. 13 shows the use of channels 1350 in conjunction with the workpiece retention pins 1300.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A load lock comprising:
   a top wall comprising a recessed central portion and a lip surrounding the recessed central portion;
   a bottom wall configured to hold a workpiece;
   a plurality of side walls, wherein the top wall, the bottom wall and the side walls define an upper chamber;
   a valve in communication with the upper chamber and in communication with a pump to extract air from the upper chamber;
   a first actuator to move the top wall between a first open position and a second closed position, where the recessed central portion fills a portion of the upper chamber and the lip rests on a top surface of the side walls; and
   a second actuator in communication with the bottom wall to move the bottom wall between a first position, where the bottom wall, the side walls and the top wall form a sealed upper chamber, and a second position, lower than the first position.

2. The load lock of claim 1, where the valve comprises a horizontal poppet valve in communication with the upper chamber and with the pump.

3. The load lock of claim 1, wherein the bottom wall comprises retractable pins extending upward from the surface of the bottom wall to support the workpiece.

4. The load lock of claim 1, further comprising a workpiece holding mechanism disposed on the bottom wall, to hold the workpiece on the bottom wall while the pump is active.

5. The load lock of claim 4, wherein the workpiece holding mechanism comprises a vacuum chuck on the bottom wall.

6. The load lock of claim 4, wherein the workpiece holding mechanism comprises a channel disposed on an upper side of the bottom wall to allow airflow between the bottom wall and the workpiece disposed on the bottom wall.

7. The load lock of claim 4, wherein the workpiece holding mechanism comprises a plurality of projections disposed on an upper side of the bottom wall on which the workpiece is disposed, allowing airflow between the movable bottom wall and the workpiece.

8. The load lock of claim 1, further comprising a second chamber disposed below the upper chamber, such that the bottom wall separates the upper chamber from the second chamber when in the first position.

9. The load lock of claim 8, wherein a volume of the upper chamber and the second chamber are united when the bottom wall is in the second position.

10. The load lock of claim 1, further comprising a magnetic clamp to hold the bottom wall in the first position.

11. A method of transferring a workpiece from a first environment at a first pressure to a second environment at a second pressure, lower than the first pressure, using a load lock having a top wall, a bottom wall, and a plurality of side walls, defining an upper chamber, the method comprising:
   opening the top wall, while the bottom wall is in a first position;
   loading the workpiece into the upper chamber;
   replacing the top wall so as to form a sealed upper chamber;
   extracting air from the upper chamber such that pressure within the upper chamber is a third pressure less than the first pressure and greater than the second pressure; and
   lowering the bottom wall to a second position once the upper chamber is at the third pressure, to expose the workpiece to the second environment.

12. A load lock comprising:
   a top wall, having a recessed central portion and a lip surrounding the recessed central portion;
   a wafer holder, disposed in the top wall having a plurality of shelves configured to hold a workpiece, extending downward from an underside of the recessed central portion;
   a bottom wall;
   a plurality of side walls, wherein the top wall, the bottom wall and the side walls define an upper chamber;
   a valve in communication with the upper chamber and in communication with a pump to extract air from the upper chamber;
   a first actuator to move the top wall between a first open position and a second closed position, where the recessed central portion extends into a volume defined by the side walls and the bottom wall and the lip rests on a top surface of the side walls;
   a second actuator in communication with the bottom wall to move the bottom wall between a first position, where the bottom wall is sealed against the side walls, and a second position, where the bottom wall is not sealed against the side walls; and
   a third actuator in communication with the shelves to move the shelves between a first position where there is a gap between the underside of the recessed central portion and the shelves so that a robotic mechanism may access the workpiece, and a second position where the workpieces are proximate the underside of the recessed central portion.

13. The load lock of claim 12, further comprising a magnetic clamp to hold the bottom wall in the first position.

14. The load lock of claim 13, wherein an electrically switchable permanent magnet is disposed in the bottom wall and a magnetically attractive material is disposed in the side walls.

15. The lock load of claim 9, further comprising a second load lock, comprising:
   a second top wall comprising a second recessed central portion and a second lip surrounding the second recessed central portion;
   a second bottom wall configured to hold a workpiece;
   a plurality of second side walls, wherein the second top wall, the second bottom wall and the second side walls define a second upper chamber;

a second valve in communication with the second upper chamber and in communication with a pump to extract air from the second upper chamber;

a third actuator to move the second top wall between a first open position and a second closed position, where the second recessed central portion fills a portion of the second upper chamber and the second lip rests on a top surface of the second side walls; and a fourth actuator in communication with the second bottom wall to move the second bottom wall between a first position, where the second bottom wall, the second side walls and the second top wall form a sealed second upper chamber, and a second position, lower than the first position, where the volume of the second upper chamber and the second chamber are united.

16. The load lock of claim 15 where the second chamber comprises a processing chamber.

17. The load lock of claim 10, wherein an electrically switchable permanent magnet is disposed in the bottom wall and a magnetically attractive material is disposed in the side walls.

* * * * *